United States Patent
Boroson et al.

(10) Patent No.: US 7,812,531 B2
(45) Date of Patent: Oct. 12, 2010

(54) PREVENTING STRESS TRANSFER IN OLED DISPLAY COMPONENTS

(75) Inventors: Michael L. Boroson, Rochester, NY (US); Michele L. Ricks, Rochester, NY (US); Thomas W. Palone, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 196 days.

(21) Appl. No.: 11/782,797

(22) Filed: Jul. 25, 2007

(65) Prior Publication Data

US 2009/0026945 A1  Jan. 29, 2009

(51) Int. Cl.
H05B 33/00 (2006.01)
H01J 1/62 (2006.01)

(52) U.S. Cl. .................................... 313/512
(58) Field of Classification Search .......... 313/498–512
See application file for complete search history.

(56) References Cited

U.S. PATENT DOCUMENTS

| 4,769,292 A | 9/1988 | Tang et al. |
| 4,885,211 A | 12/1989 | Tang et al. |
| 2001/0013756 A1 | 8/2001 | Mori et al. |
| 2005/0062412 A1* | 3/2005 | Taniguchi et al. ............ 313/512 |
| 2008/0284925 A1* | 11/2008 | Han ............................ 349/12 |

FOREIGN PATENT DOCUMENTS

| EP | 1 448 026 | 8/2004 |
| JP | 11329716 | 11/1999 |
| JP | 11339954 | 12/1999 |
| JP | 2001118674 | 4/2001 |

* cited by examiner

*Primary Examiner*—Joseph L Williams
(74) *Attorney, Agent, or Firm*—Morgan Lewis & Bockius LLP

(57) ABSTRACT

An OLED display, comprising: a substrate; an OLED having two spaced-apart electrodes and organic layers disposed there between, and the OLED disposed over the substrate; an encapsulation container fixed by perimeter seal to the substrate and disposed over the OLED to provide an enclosure; and the substrate or the encapsulation container, or both, including compliant regions that flex, compress, or expand under stress and reduce stress transfer between the substrate and the encapsulation container through the perimeter seal.

2 Claims, 2 Drawing Sheets

PREVENTING STRESS TRANSFER IN OLED DISPLAY COMPONENTS

FIELD OF THE INVENTION

The present invention relates to OLED displays and more particularly to providing moisture protection for the OLED in the display.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing, and capability for full-color flat emission displays. Tang et al. described this multilayer OLED device in their U.S. Pat. Nos. 4,769,292 and 4,885,211.

A common problem with OLED displays is sensitivity to moisture. They can be particular highly moisture-sensitive electronic devices, and require humidity control to levels below about 1000 ppm and some require humidity control below even 100 ppm. Often, an encapsulation container encloses the OLED device and is secured to the substrate to form an enclosure. Desiccant material is formed on the inside surface of the enclosure to protect the OLED from moisture. A problem with this arrangement is that stress can be transferred between the substrate and the encapsulation container thereby causing mechanical damage to either or either of such elements (e.g. cracking) or to the adhesive used to secure the substrate and encapsulation container (e.g. delamination or cracking). This is particularly a problem as the OLED displays become larger and can flex during handling. This can also be a problem when the substrate and the encapsulation container comprise different materials with different coefficients of expansion.

SUMMARY OF THE INVENTION

It is therefore an object of the present invention to provide an OLED display sealed against moisture that it reduces damage to a substrate and a perimeter seal.

This object is achieved by an OLED display, comprising:
 a. a substrate;
 b. an OLED having two spaced-apart electrodes and organic layers disposed there between and the OLED being disposed over the substrate;
 c. an encapsulation container fixed by perimeter seal to the substrate and disposed over the OLED to provide an enclosure; and
 d. the substrate or the encapsulation container or both, including compliant regions that flex, compress, or expand under stress and reduce stress transfer between the substrate or the encapsulation container through the perimeter seal.

It is an advantage of this invention that it reduces damage to the substrate, to an encapsulation container, and to a perimeter seal joining the substrate and encapsulation container in an OLED display. It is a further advantage of this invention that it permits the use of materials with different expansion characteristics for the substrate and encapsulation container. It is a further advantage of this invention that it reduces damage to the OLED display caused by other types of stress, such as flexing. It is a further advantage of this invention that the reduction in damage will increase yield in manufacturing and reduce the cost of OLED displays.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. The term "bottom-emitting" refers to display devices that emit light and are viewed through the substrate upon which they are based. The term "top-emitting" refers to display devices in which light is primarily not emitted through the substrate but opposite to the substrate, and are viewed through the side opposite to the substrate. The term "desiccant" is employed to designate organic or inorganic materials used to physically or chemically absorb or react with moisture that would otherwise damage the highly moisture-sensitive electronic devices.

Figure 1:
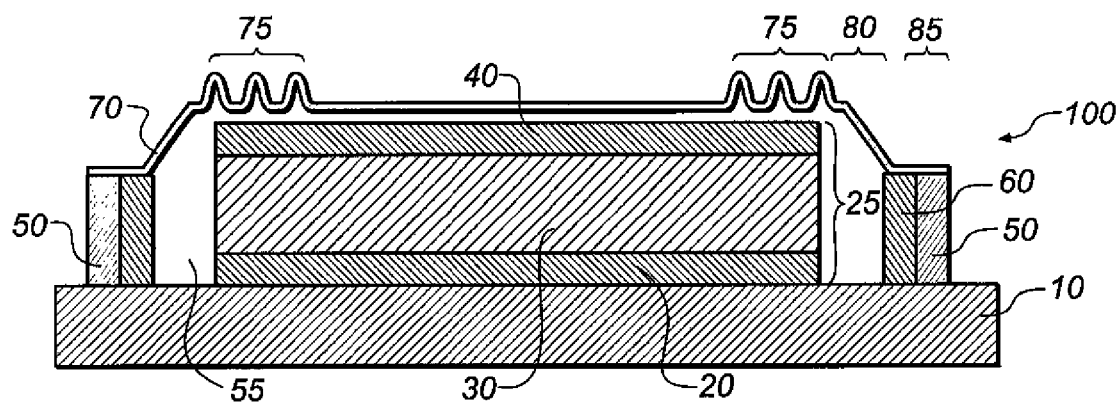
FIG. 1 shows a cross-sectional view of one embodiment of an encapsulated OLED display including compliant regions according to this invention.

Turning now to FIG. 1, there is shown a cross-sectional view of one embodiment of an encapsulated OLED display including compliant regions according to this invention. OLED display 100 is formed over substrate 10. OLED display 100 includes an OLED 25 disposed over substrate 10 and having organic layers 30 disposed between two spaced-apart electrodes 20 and 40. An encapsulation container 70 is disposed over OLED 25 and is fixed to substrate 10 by perimeter seal 50, providing enclosure 55. A desiccant 60 can be located in enclosure 55 to protect the OLED display from moisture incursion around or through perimeter seal 50. Encapsulation container 70 includes one or more compliant regions 75 that can flex, compress, or expand under stress. The compressing, expanding, or flexing of compliant regions 75 under stress reduces the stress transferred from encapsulation container 70 to substrate 10 or to perimeter seal 50, and from substrate 10 to encapsulation container 70 or to perimeter seal 50. Encapsulation container 70 can also include sealing base 85, which is a region designed to form a seal with perimeter seal 50, and a fitting region 80, which is designed to shape the encapsulation container to fit over OLED 25. Flexing, compressing, or expanding of the compliant regions also reduces the stress transferred from the inner portion of the encapsulation container 70 to the seal base 85. The compliant regions can be formed by any way that provides for sufficient flexing, compressing, or expanding. The compliant regions can comprise multiple bends in a thin flexible material such as metal foils, polymer films, or rubbers to form accordion-like regions. Alternately, solid compliant materials such as polymers can form the compliant regions or rubbers that have sufficiently low modulus. These solid compliant materials can be a single material or composite materials including other organic or inorganic components.

Encapsulation container 70 can comprise an organic solid, an inorganic solid, or a combination of organic and inorganic solids. Encapsulation container 70 can be flexible, or can include a flexible portion and a rigid portion, and can be processed as separate individual pieces, such as sheets or wafers, or as continuous rolls. Typical encapsulation container materials include glass, plastic, metal, ceramic, semiconductor, metal oxide, metal nitride, metal sulfide, semiconductor oxide, semiconductor nitride, semiconductor sulfide, carbon or combinations thereof. Encapsulation container 70, or a portion thereof, can be a flexible foil, e.g. a metal foil such as aluminum foil, a metal-coated polymer sheet, or a multilayer laminated foil comprising a polymer layer, a graphite layer, and a layer of aluminum foil. One example of the latter material is eGraf, which is commercially available from Graftech. In one desirable embodiment, encapsulation container 70 is a metal foil. The portion of encapsulation container 70 over organic layers 30 is transparent if OLED display 100 is top-emitting, but portions that cover non-emitting regions can be opaque. Encapsulation container 70 can be a homogeneous mixture of materials, a composite of materials, multiple layers of materials, or an assembly of multiple materials such as a rigid transparent window with an opaque frame and flexible foil in the compliant regions.

Figure 2:
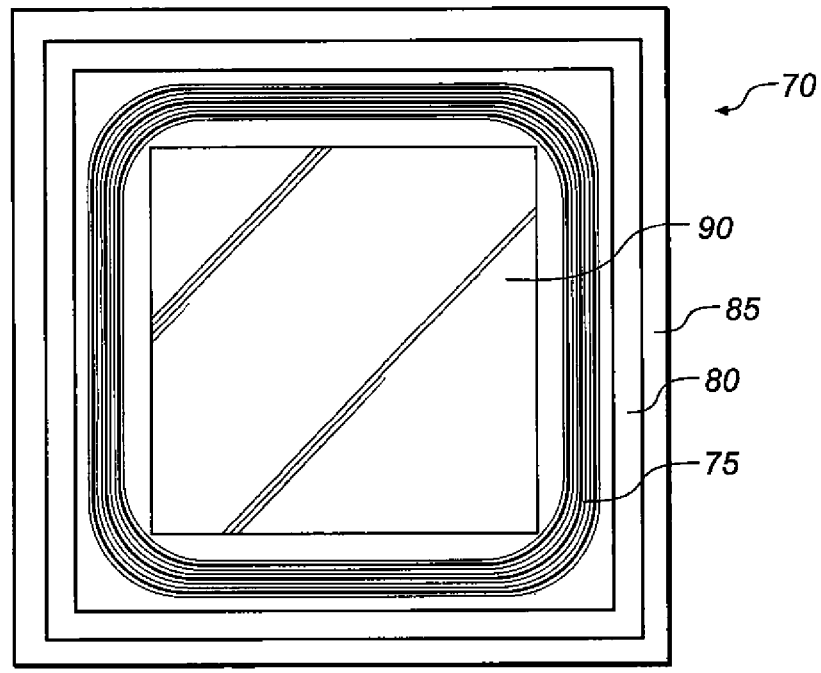
FIG. 2 shows a top view of one embodiment of an encapsulation container as used in FIG. 1.

Turning now to FIG. 2, there is shown a top view of one embodiment of an encapsulation container 70 as used in FIG. 1. Sealing base 85 encircles the entire encapsulation container, to provide a complete seal around the OLED display. To reduce stress transfer, compliant region 75 can be provided inside sealing base 85. All or part of encapsulation container 70 can be formed of a flexible foil. Encapsulation container 70 is desirably formed of flexible foil in compliant region 75, and the compliant regions can be provided by spaced-apart bends in the foil. Other regions of encapsulation container 70 can be flexible or rigid. Encapsulation container 70 can also include a rigid portion 90 disposed between or within the compliant regions. Rigid portion 90 can be transparent, e.g. for viewing a top-emitting OLED display.

Figure 3:
FIG. 3 shows a cross-sectional view of another embodiment of an encapsulation container according to this invention.

Turning now to FIG. 3, there is shown a cross-sectional view of another embodiment of an encapsulation container according to this invention. Encapsulation container 150 has a compliant region 160 on the vertical portions of the encapsulation container.

Figure 4:
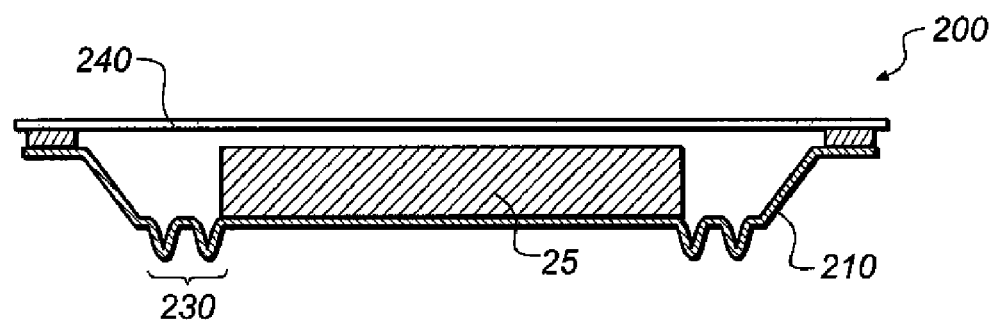
FIG. 4 shows a cross-sectional view of another embodiment of an encapsulated OLED display including compliant regions according to this invention.

Turning now to FIG. 4, there is shown a cross-sectional view of another embodiment of an encapsulated OLED display including compliant regions according to this invention. OLED display 200 includes a substrate 210 that is formed of a flexible material. The substrate 210 can be plastic with a moisture barrier coating or can be a transparent portion of glass or plastic with compliant regions and seal regions of metal foil, plastic, rubber, or other compliant materials. For top emitting OLED devices the substrate 210 can be opaque and can be formed of a metal foil or rigid metal with compliant regions of metal foil, plastic, rubber, or other compliant materials. Substrate 210 can include compliant regions 230 that are provided by spaced-apart bends in the substrate, by solid compliant materials as discussed in FIG. 1, or by flexures formed in the substrate as described below in the embodiment of FIG. 5. Encapsulation container 240 can be a rigid material or can include compliant regions as described above.

Figure 5:
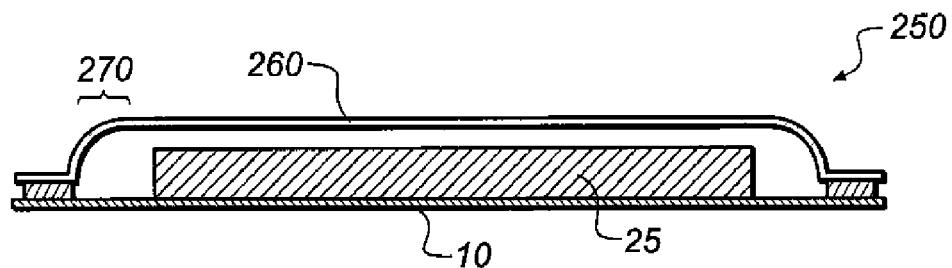
FIG. 5 shows a cross-sectional view of another embodiment of an encapsulated OLED display including compliant regions according to this invention.

Turning now to FIG. 5, there is shown a cross-sectional view of another embodiment of an encapsulated OLED display 250 including compliant regions 270 according to this invention. In this embodiment the compliant regions are formed by flexures that comprise only one or two bends in a thin flexible material such as metal foils, polymer films, or rubbers. The flexure formed by the combination of the material and the geometry must be capable of reducing the stress transferred between encapsulation container 260 and substrate 10 through the perimeter seal.

A key design parameter for the flexure-type compliant regions of the embodiment of FIG. 5 and the compliant regions of the embodiments of FIG. 1, FIG. 2, FIG. 3, and FIG. 4 relates to the level of stress transferred between the substrate and the encapsulation container through the perimeter seal. The level of stress transferred due to thermal expansion or contraction, due to flexing of the OLED display, or due to any other forces applied to the substrate, encapsulation container, or the perimeter seal must remain less than the cohesive and adhesive strengths of the substrate, encapsulation container, and perimeter seal. Delamination of the encapsulation container from the perimeter seal or the substrate from the perimeter seal is particularly sensitive to peel forces between the perimeter seal and either the encapsulation container or the substrate. To insure robust encapsulation of the OLED display, the compliant regions must be designed to maintain peel stress levels below the peel strength of both the perimeter seal to substrate and the perimeter seal to encapsulation container. The specific level of compliance depends on the material choices for the substrate, encapsulation container, and perimeter seal, as well as the level of stress to which the OLED display will exposed during the manufacturing and use of the display.

Perimeter seal 50 can be organic, inorganic, or a combination of organic and inorganic. The organic perimeter seal material can include epoxies, polyurethanes, acrylates, silicones, polyamides, polyolefins, and polyesters, or combinations thereof. The inorganic perimeter seal material can include glass, ceramic, metal, semiconductor, metal oxide, semiconductor oxide, and metal solder, or combinations thereof. The perimeter seal can be bonded between the substrate and the encapsulation container in a bonding step accomplished by pressing, by melting and cooling, by reaction curing, or by a combination thereof. Typical materials bonded by pressure include pressure-sensitive adhesives. Typical materials bonded by melting and cooling include glass; hot melt adhesives such as polyolefins, polyesters, polyamides, or combinations thereof, or inorganic solders such as indium, tin, lead, silver, gold, or combinations thereof. Typical reaction curing methods include reactions resulting from heat, radiation such as UV radiation, mixing of two or more components, removal of ambient oxygen, or combinations thereof. Typical materials bonded by reaction curing include acrylates, epoxies, polyurethanes, silicones, or combinations thereof. Other inorganic materials typically used in adhesive materials include glass, ceramic, metal, semiconductor, metal oxide, semiconductor oxide, or combinations thereof.

Stress in the OLED display can come from several sources. The substrate or the encapsulation container, or both, can flex. The stress from one (the substrate or the encapsulation container) can be transferred to the other through one or more parts of the perimeter seal. Alternatively, the temperature of the OLED display can change, either through changes in the environment of the OLED display, or through heating and cooling of the display itself by its own functioning. Such heating and cooling will cause expansion and contraction of the materials comprising the display. If the substrate and encapsulation container are formed from different materials with different coefficients of expansion, the different expansion rates can cause stress to be placed upon the perimeter seal, or cause stress to be transferred between the substrate and encapsulation container through the perimeter seal. Such stress can break the perimeter seal, or crack or break a fragile part of the OLED display, e.g. a glass substrate. Compliant regions that flex, expand, or compress under the stress can reduce the stress transferred to or through the perimeter seal.

The substrate can be an organic solid, an inorganic solid, or a combination of organic and inorganic solids. The substrate can be rigid or flexible and can be processed as separate individual pieces, such as sheets or wafers, or as a continuous roll. If the substrate is flexible, it is meant that it is not rigid and provides no structural benefit, e.g. glass of 1 mm thickness or less. Typical substrate materials include glass, plastic, metal, ceramic, semiconductor, metal oxide, metal nitride, metal sulfide, semiconductor oxide, semiconductor nitride, semiconductor sulfide, carbon, or combinations thereof, or any other materials commonly used in the formation of OLED devices, which can be either passive-matrix devices or active-matrix devices. The substrate can be a homogeneous mixture of materials, a composite of materials, or multiple layers of materials. The substrate can be flexible in one portion and rigid in another portion. For example, in FIG. 4, compliant region 230 can be flexible, while other parts of substrate 210 can be rigid. By rigid, it is meant that the substrate or portion thereof is not flexible enough to relieve stress, e.g. through compliant regions as described herein. This can include substrates that provide little structural benefit and include a limited degree of flexibility, e.g. glass of 1 mm thickness or less. The substrate can be an OLED substrate, that is a substrate commonly used for preparing OLED devices, e.g. active-matrix low-temperature polysilicon or amorphous-silicon TFT substrate. For a top-emitting application, where the EL emission is viewed through the top electrode, the transmissive characteristic of the bottom support is immaterial, and therefore can be light transmissive, light absorbing or light reflective. For a bottom-emitting application, where the EL emission is viewed through the bottom electrode and substrate, the substrate can be any transmissive material including, but not limited to, glass and plastic.

OLED devices that can be used in this invention have been well described in the art, and OLED display 100 can include layers commonly used for such devices. A bottom electrode 20 is formed over OLED substrate 10 and is most commonly configured as an anode, although the practice of this invention is not limited to this configuration. Example conductors for this application include, but are not limited to, indium-tin oxide, indium-zinc oxide, gold, iridium, molybdenum, palladium, platinum, aluminum or silver. If the device is bottom-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Any suitable process such as evaporation, sputtering, chemical vapor deposition, or electrochemical deposition can deposit desired anode materials. Anode materials can be patterned using well-known photolithographic processes.

Organic layers 30 comprise several layers as described in the art. While not always necessary, it is often useful that a hole-transporting layer be formed and disposed over the anode. Any suitable process such as evaporation, sputtering, chemical vapor deposition, electrochemical deposition, thermal transfer, or laser thermal transfer from a donor material can deposit desired hole-transporting materials. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Klupfel et al. in U.S. Pat. No. 3,180,730 illustrate exemplary monomeric triarylamines. In U.S. Pat. Nos. 3,567,450 and 3,658,520, Brantley et al. discloses other suitable triarylamines substituted with one or more vinyl radicals, or comprising at least one active hydrogen-containing group.

A more preferred class of aromatic tertiary amines are those which include at least two aromatic tertiary amine moieties as described in U.S. Pat. Nos. 4,720,432 and 5,061,569. Such compounds include those represented by structural Formula A.

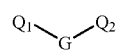

A wherein:

$Q_1$ and $Q_2$ are independently selected aromatic tertiary amine moieties; and G is a linking group such as an arylene, cycloalkylene, or alkylene group of a carbon-to-carbon bond.

In one embodiment, at least one of Q1 or Q2 contains a polycyclic fused ring structure, e.g., naphthalene. When G is an aryl group, it is conveniently a phenylene, biphenylene, or naphthalene moiety.

A useful class of triarylamines satisfying structural Formula A and containing two triarylamine moieties is represented by structural Formula B.

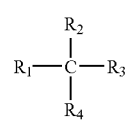

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C.

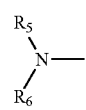

C wherein $R_5$ and $R_6$ are independently selected aryl groups. In one embodiment, at least one of $R_5$ or $R_6$ contains a polycyclic fused ring structure, e.g., naphthalene.

Another class of aromatic tertiary amines is the tetraaryldiamines. Desirable tetraaryldiamines include two diarylamino groups, such as indicated by Formula C, and linked through an arylene group. Useful tetraaryldiamines include those represented by Formula D.

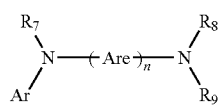

wherein:

each Are is an independently selected arylene group, such as a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g., naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate), also called PEDOT/PSS.

Light-emitting layers produce light in response to hole-electron recombination. The light-emitting layers are commonly disposed over the hole-transporting layer. Any suitable process such as evaporation, sputtering, chemical vapor deposition, electrochemical deposition, or radiation thermal transfer from a donor material can deposit desired organic light-emitting materials. Useful organic light-emitting materials are well known. As more fully described in U.S. Pat. Nos. 4,769,292 and 5,935,721, the light-emitting layers of the OLED element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768, 292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

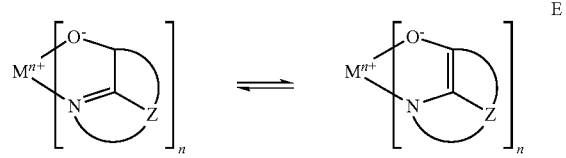

wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in the light-emitting layers can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-paraphenylene derivatives, and polyfluorene derivatives, as taught by Wolk et al. in commonly assigned U.S. Pat. No. 6,194,119 B1 and references cited therein.

While not always necessary, it is often useful to include an electron-transporting layer disposed over the light-emitting layers. Any suitable process such as evaporation, sputtering, chemical vapor deposition, electrochemical deposition, thermal transfer, or laser thermal transfer from a donor material can deposit desired electron-transporting materials. Preferred electron-transporting materials for use in the electron-transporting layer are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Certain benzazoles are also useful electron-transporting materials. Other electron-transporting materials can be polymeric substances, e.g. polyphenylenevinylene derivatives, poly-paraphenylene derivatives, polyfluorene derivatives, polythiophenes, polyacetylenes, and other conductive polymeric organic materials known in the art.

An upper electrode 40 most commonly configured as a cathode is formed over the electron-transporting layer, or over the light-emitting layers if an electron-transporting layer is not used. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Evaporation, sputtering, or chemical vapor deposition can deposit cathode materials. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

OLED display 100 can include other layers as well. For example, a hole-injecting layer can be formed over the anode, as described in U.S. Pat. No. 4,720,432, U.S. Pat. No. 6,208,075, EP 0 891 121 A1, and EP 1 029 909 A1. An electron-injecting layer, such as alkaline or alkaline earth metals, alkali halide salts, or alkaline or alkaline earth metal-doped organic layers, can also be present between the cathode and the electron-transporting layer.

Desiccant 60 is used to physically or chemically absorb or react with moisture that would otherwise damage the highly moisture-sensitive OLED 25. The level of moisture inside OLED display 100 must be kept below 1000 ppm, and in some cases even lower. Therefore, the second desiccant material has an equilibrium humidity level less than 1000 ppm. Typical moisture-absorbing materials meeting this requirement include metals such as alkali metals (e.g. Li, Na), alkaline earth metals (e.g. Ba, Ca), or other moisture-reactive metals (e.g. Al, Fe); alkaline metal oxides (e.g. $Li_2O$, $Na_2O$); alkaline earth metal oxides (e.g. MgO, CaO, BaO); sulfates (e.g. anhydrous $MgSO_4$); metal halides (e.g. $CaCl_2$); perchlorates (e.g. $Mg(ClO_4)_2$); molecular sieves; tris(8-quinolinolato)aluminum (Alq) and aluminum/Alq mixtures; organometallic compounds described by Takahashi et al. in U.S. Pat. No. 6,656,609 and by Tsuruoka et al. in U.S. Patent Application 2003/0110981, including organometallic compounds of the type:

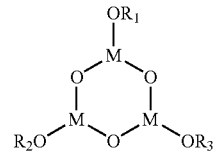

wherein $R_1$, $R_2$, and $R_3$ are selected from the group consisting of alkyl groups, aryl groups, cycloalkyl groups, heterocyclic groups, and acyl groups having one or more carbon atoms, and M is a trivalent metallic atom; organometallic compounds of the type:

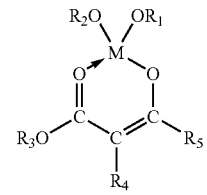

wherein each of $R_1$, $R_2$, $R_3$, $R_4$, and $R_5$ is selected from the group consisting of alkyl groups, alkenyl groups, aryl groups, cycloalkyl groups, heterocyclic groups, and acyl groups having one or more carbon atoms, and M is a trivalent metal atom; organometallic compounds of the type:

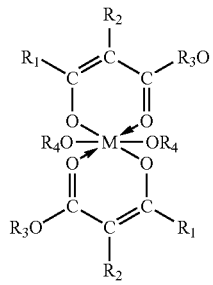

wherein each of $R_1$, $R_2$, $R_3$, and $R_4$ is selected from the group consisting of alkyl groups, alkenyl groups, aryl groups, cycloalkyl groups, heterocyclic groups, and acyl groups having one or more carbon atoms, and M is a tetravalent metal atom; and metals with work functions less than 4.5 eV and oxidizable in the presence of moisture, or combinations thereof. Moisture-absorbing material can be packaged within moisture permeable containers or binders. Desiccant 60 can be a single material, a homogeneous mixture of materials, a composite of materials, or multiple layers of materials, and can be deposited from a vapor or from solution, or they can be provided in a porous matrix such as a permeable package or tape. Particularly useful desiccant materials include those that are particulate materials formed into a polymeric matrix that can be patterned, as described by Boroson et al. in U.S. Pat. No. 6,226,890.

The invention has been described in detail with particular reference to certain preferred embodiments thereof, but it will be understood that variations and modifications can be effected within the spirit and scope of the invention.

PARTS LIST 10 substrate
20 electrode
25 OLED
30 organic layers
40 electrode
50 perimeter seal
55 enclosure
60 desiccant
70 encapsulation container
75 compliant region
80 fitting region
85 sealing base
90 rigid portion
100 OLED display
150 encapsulation container
160 compliant region
200 OLED display
210 substrate
230 compliant region
240 encapsulation container
250 OLED display
260 encapsulation container
270 compliant region

The invention claimed is:

1. An OLED display, comprising:
    a. a substrate;
    b. an OLED having two spaced-apart electrodes and organic layers disposed there between, and the OLED disposed over the substrate; and
    c. an encapsulation container fixed by a perimeter seal to the substrate and disposed over the OLED to provide an enclosure, a flexible foil located in a portion of the encapsulation container that is opposite and substantially parallel to the substrate surface;
    wherein the encapsulation container includes compliant regions provided by spaced-apart bends in the flexible foil, such compliant regions providing flexibility, compressibility, or expandability under stress to thereby reduce stress transfer between the substrate and the encapsulation container through the perimeter seal.

2. An OLED display, comprising:
    a. a substrate;
    b. an OLED having two spaced-apart electrodes and organic layers disposed there between, and the OLED disposed over the substrate; and
    c. an encapsulation container fixed by a perimeter seal to the substrate and disposed over the OLED to provide an enclosure;
    wherein the substrate is formed of a flexible material and includes compliant regions provided by spaced-apart bends or flexures in the substrate, such compliant regions providing flexibility, compressibility, or expandability under stress to thereby reduce stress transfer between the substrate and the encapsulation container through the perimeter seal.

* * * * *